United States Patent [19]

Malka et al.

[11] Patent Number: 4,644,268

[45] Date of Patent: Feb. 17, 1987

[54] APPARATUS AND METHOD FOR DETERMINING THE MAGNITUDE AND PHASE OF THE FUNDAMENTAL COMPONENT OF A COMPLEX WAVESHAPE

[75] Inventors: Jacob H. Malka, Fair Lawn; Joseph P. Hartmann, Ridgewood, both of N.J.

[73] Assignee: Allied-Signal Corporation, Morris Township, Morris County, N.J.

[21] Appl. No.: 721,101

[22] Filed: Apr. 8, 1985

[51] Int. Cl.⁴ .......................................... G01R 25/00
[52] U.S. Cl. ................... 324/83 R; 324/77 A; 324/77 B; 324/121 R
[58] Field of Search ............ 324/76 R, 77 R, 77 B, 324/77 A, 77 D, 78 R, 78 D, 78 E, 79 D, 83 R, 83 D, 121 R; 328/150, 151, 155; 307/351, 354

[56] References Cited

U.S. PATENT DOCUMENTS

| | | | |
|---|---|---|---|
| 4,015,262 | 3/1977 | Etcheverry | 324/83 D |
| 4,054,785 | 10/1977 | Lehmann | 324/77 D |
| 4,118,666 | 10/1978 | Bernstein | 324/77 B |
| 4,321,565 | 3/1982 | Ward | 324/83 R |
| 4,410,970 | 10/1983 | Law | 324/77 D |
| 4,536,760 | 8/1985 | Navarro | 324/121 R |
| 4,563,637 | 1/1986 | DeBortoli | 324/77 A |

Primary Examiner—Michael J. Tokar
Attorney, Agent, or Firm—Howard G. Massung; Stanley N. Protigal; Anthony F. Cuoco

[57] ABSTRACT

Apparatus and method for extracting the fundamental component of a complex waveshape ($E_T$) and for determining the magnitude (V) and phase $\theta$ of the fundamental component are disclosed. The complex waveshape is converted into digital data relative to a reference signal ($E_R$) and the in-phase ($x_1$) and quadrature ($y_1$) components of the fundamental component are determined by a graphical Fourier analysis of the digital data so that the magnitude and phase of the fundmental component relative to the reference signal ($E_R$) can be determined.

11 Claims, 3 Drawing Figures

APPARATUS AND METHOD FOR DETERMINING THE MAGNITUDE AND PHASE OF THE FUNDAMENTAL COMPONENT OF A COMPLEX WAVESHAPE

BACKGROUND OF THE INVENTION

Complex waveshapes are often used in electronic equipment such as, for example, automatic test equipment for testing the parameters of a unit under test. In these circumstances, it is desirable to extract as much information as possible from the complex waveshape, particularly with respect to a reference signal. For example, it is desirable to determine both the in-phase and quadrature component of the complex waveshape and to determine the magnitude and phase of its fundamental component with respect to the reference signal. Additionally, complex waveshapes and reference signals having relatively wide magnitude, frequency and phase angle ranges must be accomodated with a relatively high resolution and accuracy.

Accordingly, it is the object of the present invention to provide apparatus and method using digitizing techniques for enabling a graphical Fourier analysis whereby the desired information is extracted from the complex waveshape.

SUMMARY OF THE INVENTION

This invention contemplates apparatus and method for extracting the fundamental component from a complex waveshape and for determining the magnitude and phase of the fundamental component relative to a reference signal.

The gain of an analog signal having the complex waveshape is adjusted so that the signal has a peak amplitude within a predetermined range. The gain adjustment is controlled by commands provided by a central processing unit (CPU). The gain adjusted signal is applied to a sample and hold circuit and therefrom to an analog to digital converter for digitizing in response to commands from the CPU. The CPU provides commands for controlling the sampling rate of the sample and hold circuit by controlling a counter in a phase-lock loop, whereby a predetermined number of samples are taken over one cycle of the complex waveshape.

So that the exact timing of the complex waveshape relative to the reference signal is established, the reference signal is applied to a zero crossing detector. The zero crossing of the reference signal drives the phase-lock loop and control logic to initiate the first digitized sample of a measurement cycle.

The measurement cycle is initiated in response to a command from the CPU. A memory device stores the digitized, sampled data. The stored data is read out by the CPU. The CPU is programmed to then determine the Fourier coefficients for the fundamental component of the complex waveshape via a graphical integration. Once these coefficients have been determined, both the magnitude of the fundamental component and its phase with respect to the reference signal are determined.

DETAILED DESCRIPTION OF THE INVENTION

Figure 1:
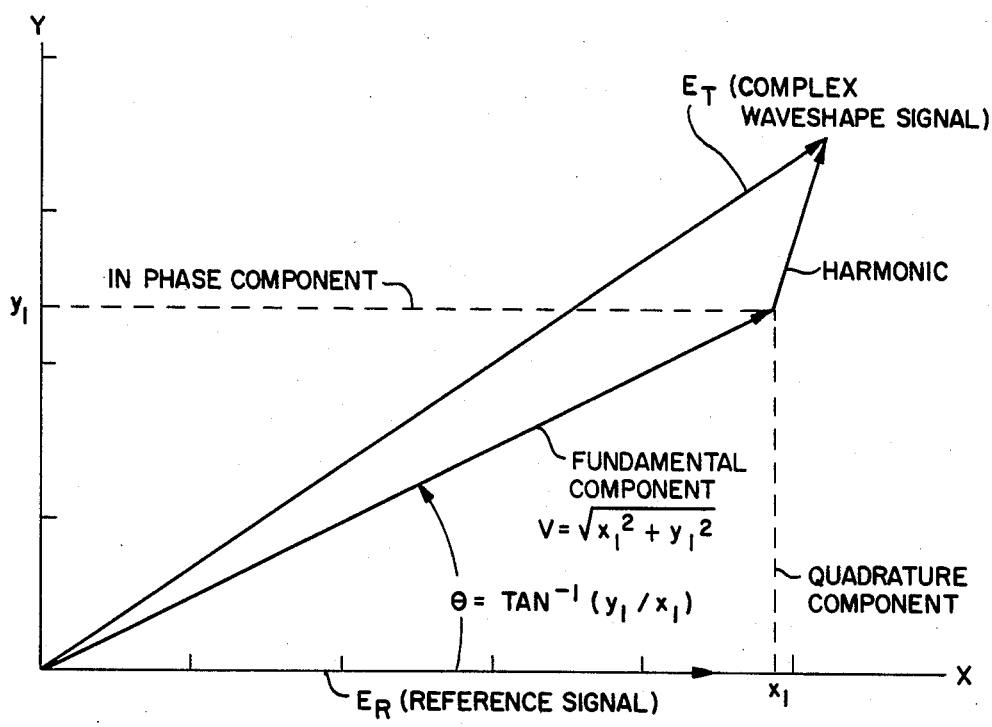
FIG. 1 is a graphical representation illustrating the relationship between a reference signal vector ($E_R$) and a complex waveshape signal vector ($E_T$).

With reference to the graphical representation of FIG. 1, an analog reference signal is designated as $E_R$ and an analog complex waveshape signal is designated as $E_T$. The in-phase component of the complex waveshape signal is at the graphical coordinates $X=x$, $Y=0$, and the quadrature component is at the coordinates $Y=y$, $X=0$.

The phase angle $\theta$ between reference signal $E_R$ and the fundamental component of the complex waveshape signal $E_T$ is designated as:

$$\theta = \text{Tan}^{-1}(y_1/x_1). \tag{1}$$

The magnitude V of the fundamental component of complex waveshape signal $E_T$ is designated as:

$$V = \sqrt{x_1^2 + y_1^2}. \tag{2}$$

Figure 2:
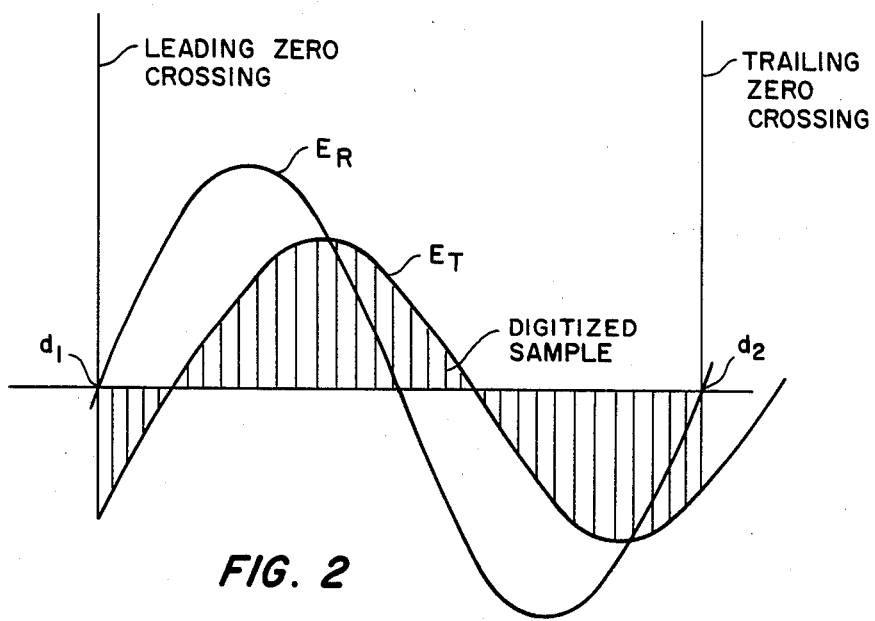
FIG. 2 is a graphical representation illustrating the waveshapes of the complex waveshape ($E_T$) and reference signals ($E_R$).

With reference to the graphical representation of FIG. 2, the waveshape of complex waveshape signal $E_T$ is shown superimposed on the waveshape of reference signal $E_R$. In accordance with the invention, digitized samples of signal $E_T$ are taken, with the first digitized sample being taken at a point $d_1$ which coincides with the leading zero crossing of reference signal $E_R$. the last digitized sample of complex waveshape signal $E_T$ is taken at a point $d_2$ which coincides with the trailing zero crossing of reference signal $E_R$. The significance of the zero crossing of reference signal $E_R$ will be hereinafter more fully explained.

Figure 3:
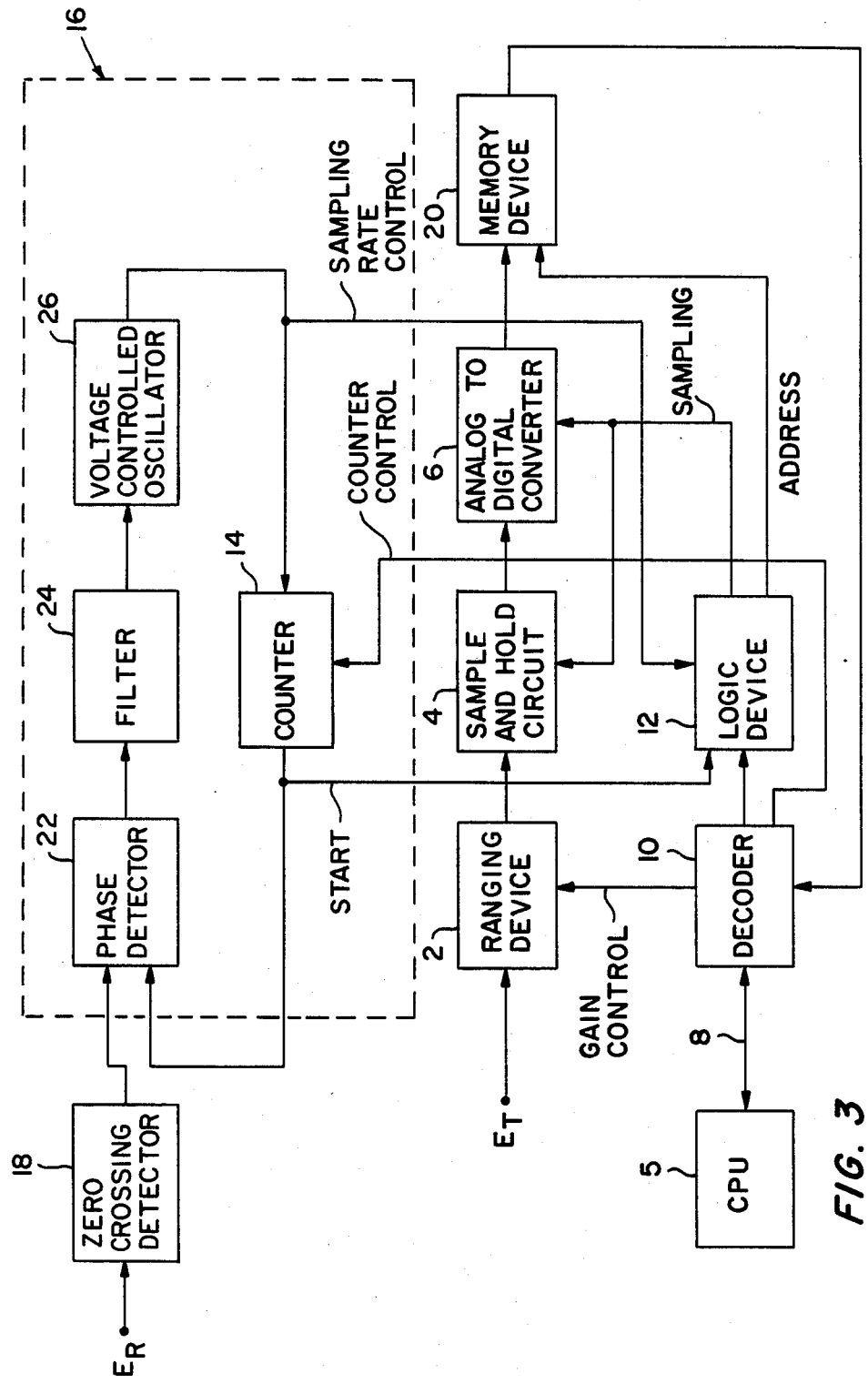
FIG. 3 is a block diagram illustrating apparatus according to the invention.

With the relationships shown in FIGS. 1 and 2 in mind, reference is now made to FIG. 3.

Thus, analog complex waveshape signal $E_T$ is applied to a ranging device 2 which adjusts the gain of the signal so that it has a peak magnitude within a predetermined range such as, for example, 3.5 to 7.2 volts. The gain adjusted signal from ranging device 2 is applied to a sample and hold circuit 4 and therefrom to a high speed analog to digital converter 6 for digitizing.

The gain adjustment of ranging device 2 is controlled by commands from a central processing unit (CPU) 5 applied over an input/output line 8 to a decoder 10 and therefrom to ranging device 2. In this regard, it will be understood that ranging device 2 may include an arrangement of multiplying digital to analog converters and gain selectable amplifiers responsive to the gain control signal from decoder 10 for providing the desired gain adjustment or ranging characteristics to signal $E_T$.

Analog to digital converter 6 which may be, for example, a twelve-bit analog to digital converter, digitizes the signal from the sample and hold circuit 4 and provides digital data corresponding to signal $E_T$ in response to a command from CPU 5 applied over input/output line 8 to decoder 10 and therefrom to a logic device 12 which applies a sampling signal to sample and hold circuit 4 and to analog to digital converter 6.

The sampling rate is controlled by a command from CPU 5 applied over input/output line 8 to decoder 10 and therefrom to logic device 12. Decoder 10 provides a control signal which is applied to a counter 14 in a phase lock loop 16. For purpose of example, counter 14 may be dividing 32/64 counter, so that either 33 or 65 digitized samples will be taken over one cycle of complex waveshape signal $E_T$. The maximum sampling rate of analog to digital converter 6 may be, for example, 288 KHZ for a 4,500 HZ signal $E_T$ and a maximum of 65 digitized samples per cycle of signal $E_T$.

In order to establish the exact timing between reference signal $E_R$ and the digitized data corresponding to signal $E_T$ provided by analog to digital converter 6, signal $E_R$ is applied to a zero crossing detector 18 for synchronizing the first digitized sample of a measurement cycle (point $d_1$ in FIG. 2). Phase lock loop 16 is used to establish an integral number (for example 32 or 64) sample periods over a complete cycle of signal $E_T$.

A digitizing measurement cycle is initiated by a command from CPU 5 applied over input/output line 8 to decoder 10 and therefrom to logic device 12 which addresses a memory device 20. Memory device 20 may be, for example, a 1K by 16 memory, stores the digitized sampled data from analog to digital converter 6 in the first 33 or 65 addresses of the memory.

With specific reference to phase lock loop 16 shown in FIG. 3, the output of counter 14 is applied to a phase detector 22, as is the output of zero crossing detector 18. The output of phase detector 22 is applied to a loop filter 24 and therefrom to a voltage controlled oscillator 26. The output from voltage controlled oscillator 26 is fed back to counter 14 and is applied as a sampling rate control signal to logic device 12. The output of counter 14 is applied as a start signal to the logic device.

The output of memory device 20 is applied to decoder 10 and therefrom over input/output line 8 to CPU 5 where the memory is read out by the CPU.

After reading out memory device 20 CPU 5 determines the Fourier coefficients for the fundamental component of complex input waveshape signal $E_T$ by performing a graphical integration to solve the following equations for the $x_1$ and $y_1$ Fourier coefficients of the complex waveshape as illustrated in FIG.=1, as follows:

$$x_1 = K \int_0^{2\pi} (E_T) \sin \theta d\theta. \quad (3)$$

$$y_1 = K \int_0^{2\pi} (E_T) \cos \theta d\theta. \quad (4)$$

where K is a constant.

Once the $x_1$ and $y_1$ coefficients of the fundamental component of signal $E_T$ have been determined, both the magnitude and phase of the fundamental with respect to reference signal $E_R$ can be calculated by CPU 5 which solves equations (1) and (2).

In this regard it will be understood that CPU 5 can be programmed to perform the aforenoted integration and calculations by one with ordinary skill in the programming art, and without undue experimentation being necessary.

From the aforegoing description of the invention it will be seen that apparatus and method have been disclosed for extracting the fundamental component from a complex waveshape, whereby both the magnitude and the phase of this fundamental component can be determined. In accomplishing this purpose the complex waveshape is digitized with respect to a reference signal and the digitized data is made available to a central processing unit which determines the in-phase and quadrature components of the fundamental by means of a graphical Fourier analysis. With the information so provided the central processing unit determines the magnitude and phase of the fundamental component with respect to the reference signal.

With the above description of the invention in mind, reference is made to the claims appended hereto for a definition of the scope of the invention.

What is claimed is:

1. Apparatus for determining the magnitude and phase of the fundamental component of a complex waveshape signal relative to a reference signal, characterized by:

processing means for providing a plurality of commands;

means for adjusting the gain of the complex waveshape signal so that the said signal has a peak amplitude within a predetermined range;

means for decoding the plurality of commands and for providing a corresponding plurality of signals, and the gain adjusting means being connected to the decoding means and controlled by a first of the plurality of signals therefrom for adjusting the gain of the complex waveshape signal;

means for sampling and holding the gain adjusted complex waveshape signal, whereby a predetermined number of samples are taken over a measurement cycle of said signal;

means for digitizing said samples to provide digital data;

means for establishing a timing relationship between the reference signal and the digital data;

means for storing the digital data; and means for reading out the stored digital data and for determining the magnitude and phase of the fundamental component of the complex waveshape signal relative to the reference signal from said readout data and in accordance with said timing relationship, including the decoding means connected to the storing means for decoding the digital data stored thereby, and the processing means reading out the decoded digital data and determining the Fourier coefficients of the complex waveshape signal therefrom, and determining the magnitude and phase of the fundamental component from said coefficients.

2. Apparatus as described by claim 1, further characterized by:

logic means connected to the decoding means and responsive to certain of the plurality of signals therefrom for providing certain logic signals;

the sampling and holding means and the digitizing means connected to the logic means and responsive to a first of the certain logic signals for controlling the sampling and holding means and the digitizing means, whereby the predetermined number of samples are taken and digitized over a measurement cycle of the complex waveshape signal.

3. Apparatus as described by claim 1, further characterized by:

the means for storing the digitized data connected to the logic means and responsive to a second of the certain logic signals therefrom for being addressed thereby to initiate the measurement cycle.

4. Apparatus as described by claim 2, wherein the means for establishing a timing relationship between the reference signal and the digital data is characterized by:

means for detecting the zero crossing of the reference signal for synchronizing the first digitized sample of the measurement cycle with said zero crossing and for providing a corresponding output;

a phase lock loop connected to the zero crossing detector for establishing an integral number of sample periods over a cycle of the complex waveshape signal, and providing first and second outputs; and the logic means connected to the phase lock loop and responsive to the first output therefrom for being started thereby to provide the certain logic signals, and responsive to the second output therefrom for controlling said logic means to provide the first of the certain logic signals.

5. Apparatus as described by claim 4, wherein the phase lock loop is characterized by:

a counter for counting a predetermined number of digitized samples to be taken over the cycle of the complex waveshape signal and for providing a corresponding output;

a phase detector connected to the zero crossing detector and to the counter for providing an output corresponding to the phase difference between the zero crossing detector and counter outputs;

means for filtering the output of the phase detector;

oscillating means connected to the filter means and responsive to the filtered output for providing as oscillating output; and the counter connected to the oscillating means and to the decoding means, and responsive to the oscillating output and to a second of the plurality of signals from the decoding means for counting the predetermined number of digitized samples to be taken over the cycle of the complex waveshape signal and for providing the corresponding output.

6. Apparatus as described by claim 5, further characterized by:

the counter output being the first phase lock loop output for starting the logic means to provide the certain logic signals; and the oscillating output being the second phase lock loop output for controlling the logic device to provide the first of the certain logic signals.

7. A method for determining the magnitude and phase of the fundamental component of a complex waveshape signal relative to a reference signal characterized by:

adjusting the gain of the complex waveshape signal so that said signal has a peak amplitude within a predetermined range;

providing a plurality of commands;

decoding the plurality of commands for providing a corresponding plurality of signals;

controlling the adjusting of the gain of the complex waveshape signal in response to a first of the plurality of signals;

sampling and holding the gain adjusted complex wave-shape signal for taking a predetermined number of samples over a measurement cycle of said signal;

digitizing said samples for providing digital data;

establishing a timing relationship between the reference signal and the digital data;

storing the digital data;

reading out the stored digital data including decoding the stored digital data and reading out the decoded digital data; and determining the magnitude and phase of the fundamental component of the complex waveshape signal relative to the reference signal from said readout data and in accordance with said timing relationship, including determining the Fourier coefficients of the complex waveshap signal from the decoded digital data and determining the magnitude and phase of the fundamental component from said coefficients.

8. A method as described by claim 7, further characterized by:

responding to certain of the plurality of signals for providing certain logic signals; and responding to a first of the certain logic signals for controlling the sampling and holding of the complex waveshape signal, and for controlling the digitizing of the samples.

9. A method as described by claim 7, further characterized by:

responding to a second of the certain logic signals for initiating the measurement cycle.

10. A method as described by claim 8, wherein establishing a timing relationship between the reference signal and the digital data is characterized by:

determining the zero crossing of the reference signal for synchronizing the first digitized sample of the measurement cycle with said zero crossing; and establishing an integral number of sample periods over a cycle of the complex waveshape signal.

11. A method as described by claim 7, characterized by:

counting a predetermined number of digitized samples to be taken over the cycle of the complex waveshape signal and providing a corresponding output; and determining the phase difference between the zero crossing of the reference signal and the output corresponding to the predetermined number of digitized samples.

* * * * *